(12) United States Patent
Uno

(10) Patent No.: US 6,459,122 B2
(45) Date of Patent: Oct. 1, 2002

(54) SEMICONDUCTOR DEVICE HAVING A U-SHAPED GROOVE IN THE BODY OF THE DEVICE

(75) Inventor: Hirohiko Uno, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/916,298

(22) Filed: Jul. 30, 2001

(30) Foreign Application Priority Data

Jul. 28, 2000 (JP) ........................................ 2000-228017

(51) Int. Cl.[7] .............................................. H01L 31/119
(52) U.S. Cl. ........................ 257/330; 257/334; 257/302; 257/301
(58) Field of Search ................................ 257/330–332, 257/302, 396; 438/242, 259, 270–272, 571, 576, 579

(56) References Cited

U.S. PATENT DOCUMENTS 6,163,052 A * 12/2000 Liu et al. .................... 257/334

* cited by examiner

*Primary Examiner*—David Nelms
*Assistant Examiner*—Dung A Le
(74) *Attorney, Agent, or Firm*—Young & Thompson

(57) ABSTRACT

A semiconductor device includes a semiconductor body having grooves, unit cell regions surrounded by the grooves, and at least a field relaxation region separated by the grooves from the unit cell regions. A gate insulating film extends within the grooves and over the field relaxation regions. Gate electrodes extend over the gate insulating film, and inter-layer insulators cover the gate electrodes. A top electrode extends over the inter-layer insulators and is in contact with parts of the unit cell regions, and the top electrode has a generally flat upper surface.

8 Claims, 9 Drawing Sheets

US 6,459,122 B2

SEMICONDUCTOR DEVICE HAVING A U-SHAPED GROOVE IN THE BODY OF THE DEVICE

BACKGROUND OF THE INVENTION

1. Field of the Invention

The present invention relates to a semiconductor device, and more particularly to a semiconductor device having a U-grooved metal oxide semiconductor (UMOS)-structure, wherein a gate is provided in a groove of a body of the semiconductor device.

2. Description of the Related Art

The semiconductor device with the UMOS-structure has one or more parallel connections of plural unit cells which comprise MOS field effect transistors. The UMOS-structure has U-grooves formed in the body of the semiconductor device. The UMOS-structure also has channel layers formed in the U-grooves. In detail, the channel layers vertically extend on side walls of the U-grooves, so as to increase the degree of integration of the unit cells. Namely, the UMOS-structure allows a higher degree of integration of the unit cells than the gate-planer type semiconductor device, wherein channel layers horizontally extend on a surface of the body of the semiconductor device. The UMOS-structure allows the increase in channel width per a unit area. This reduces an ON-resistance of the device.

The U-groove is so designed that its depth is fixed but its width is adjusted in accordance with the required source-drain withstand voltage. The U-groove is formed by a selecting etching process using a mask pattern. The width of the groove is defined by the mask pattern width. For example, if the required source-drain withstand voltage is in the range of 20–60 V, then the mask pattern width may be 1 micrometer. If the required source-drain withstand voltage is in the range of 100–120 V, then the mask pattern width may be 4 micrometers. If the required source-drain withstand voltage is in the range of 200–250 V, then the mask pattern width may be 8 micrometers. The increase in the width of the groove increases the source-drain withstand voltage.

FIG. 1 is a fragmentary cross sectional elevation view of a conventional UMOS-structure of a semiconductor device, wherein a groove width is 1 micrometer. A semiconductor device 100 has a semiconductor body 1 which comprises an n+-type silicon substrate 2 and an epitaxial layer 4 overlying the n+-type silicon substrate 2. The epitaxial layer 4 has a lattice-pattern in plan view of U-grooves 3 which have a U-shape in vertically cross sectional view. Each of the U-grooves 3 has a bottom width of 1 micrometer. Gate insulating films 5 extend on the side walls and the bottom of the U-grooves 3 and also over peripheral top surface regions of the epitaxial layer, wherein the peripheral top surface region is adjacent to and surrounds the U-groove 3. Gate electrodes 6 are provided, which extend on the gate insulating films 5 so that a majority part of the gate electrode 6 is positioned within the U-groove 3. The gate electrodes 6 comprise polysilicon films.

The epitaxial layer 4 includes an n--type drain region 7, a p-type base region 8, p+-type back gate regions 9, and n+-type source regions 10, The n--type drain region 7 overlies the n+-type silicon substrate 2. The p-type base region 8 overlies the n--type drain region 7. The U-grooves 3 penetrate the p-type base region 8 and reach the upper portions of the n--type drain region 7. The p+-type back gate regions 9 are selectively provided in the p-type base region 8, so that each of the p+-type back gate regions 9 is separated by the p-type base region 8 from the adjunct U-grooves 3 and also from the n--type drain region 7. The n+-type source regions 10 are selectively provided in upper regions of the p-type base region 8 and the p+-type back gate regions 9. The n+-type source regions 10 are adjacent to the upper regions of the adjunct U-grooves 3.

Inter-layer insulators 11 are selectively provided over the gate electrodes 6 and the gate insulating films 5, so that the inter-layer insulators 11 cover the gate electrodes 6 and the gate insulating films 5. The inter-layer insulators 11 do not overly parts of the n+-type source regions 10 and the p+-type back gate regions 9. A source electrode 12 is provided which overlies the inter-layer insulators 11, the n+-type source regions 10 and the p+-type back gate regions 9, so that the source electrode 12 has an ohmic contact with the n+-type source regions 10 and the p+-type back gate regions 9. Parts of the source electrode 12 over the unit cells also serve as source pads which allows external electrical connections.

FIG. 2 is a fragmentary cross sectional elevation view of another conventional UMOS-structure of a semiconductor device, wherein a groove width is 8 micrometers. A semiconductor device 200 has a semiconductor body 21 which comprises an n+-type silicon substrate 22 and an epitaxial layer 24 overlying the n+-type silicon substrate 22. The epitaxial layer 24 has a lattice-pattern in plan view of U-grooves 23 which have a U-shape in vertically cross sectional view. Each of the U-grooves 23 has a bottom width of 8 micrometers. Gate insulating films 25 extend on the side walls and the bottom of the U-grooves 23 and also over peripheral top surface regions of the epitaxial layer, wherein the peripheral top surface region is adjacent to and surrounds the U-groove 23. Gate electrodes 26 are provided, which extend on the gate insulating films 25, so that a majority part of the gate electrode 26 is positioned within the U-groove 23. The gate electrodes 26 comprise polysilicon films.

The epitaxial layer 24 includes an n--type drain region 27, a p-type base region 28, p+-type back gate regions 29, and n+-type source regions 30. The n--type drain region 27 overlies the n+-type silicon substrate 22. The p-type base region 28 overlies the n--type drain region 27. The U-grooves 23 penetrate the p-type base region 28 and reach the upper portions of the n--type drain region 27. The p+-type back gate regions 29 are selectively provided in the p-type base region 28, so that each of the p+-type back gate regions 29 is separated by the p-type base region 28 from the adjunct U-grooves 23 and also from the n--type drain region 27. The n+-type source regions 30 are selectively provided in upper regions of the p-type base region 28 and the p+-type back gate regions 29. The n+-type source regions 30 are adjacent to the upper regions of the adjunct U-grooves 23.

Inter-layer insulators 31 are selectively provided over the gate electrodes 26 and the gate insulating films 25, so that the inter-layer insulators 31 cover the gate electrodes 26 and the gate insulating films 25. The inter-layer insulators 31 do not overly parts of the n+-type source regions 30 and the p+-type back gate regions 29. A source electrode 32 is provided which overlies the inter-layer insulators 31, the n+-type source regions 30 and the p+-type back gate regions 29, so that the source electrode 32 has an ohmic contact with the n+-type source regions 30 and the p+-type back gate regions 29. Parts of the source electrode 32 over the unit cells also serve as source pads which allows external electrical connections.

The semiconductor device 100 shown in FIG. 1 ensures the source-drain withstand voltage in the range of 20–60 V, for which purpose, the U-grooves 3 are designed so that the groove width is 1 micrometer, and that a diffusion depth of the p-type base region 8 is shallower than a depth of the U-grooves 3. Further, since the U-grooves 3 are narrow, the source electrode 12 has a generally flat top surface.

The semiconductor device 200 shown in FIG. 2 ensures the source-drain withstand voltage in the range of 200–250 V, for which purpose, the U-grooves 23 are designed so that the groove width is 8 micrometers, and that a diffusion depth of the p-type base region 28 is deeper than a depth of the U-grooves 23. Further, since the U-grooves 23 are wide, the source electrode 32 has a non-flat upper surface having depressions 33 which are positioned over the U-grooves 23. Namely, the upper surface of the source pad is not flat and has the depressions 33 which are positioned over the U-grooves 23. If a wiring layer is bonded to the non-flat upper surface of the source pad, then it is difficult to obtain a secure bonding of the wiring layer to the non-flat upper surface. Since the U-grooves 23 are wide, the area of the gate insulating film 25 sandwiched between the gate electrode 26 and the drain region 27 is large, for which reason a gate-drain capacitance is large. Upon application of a source-drain bias, a space charge region is unlikely to extend entirely in an inter-region directly under the bottom of the groove 23 and between the adjacent unit cells because of the wide width of the groove 23.

In the above circumstances, the development of a novel semiconductor device free from the above problems is desirable

SUMMARY OF THE INVENTION

Accordingly, it is an object of the present invention to provide a novel semiconductor device free from the above problems.

It is a further object of the present invention to provide a novel semiconductor device having an improved UMOS-structure, wherein a source electrode has a flat upper surface.

It is a still further object of the present invention to provide a novel semiconductor device having an improved UMOS-structure having a reduced gate-drain capacitance.

It is yet a further object of the present invention to provide a novel semiconductor device having an improved UMOS-structure allowing that upon application of a source-drain bias, a space charge region is likely to extend entirely in an inter-region directly under the bottom of the groove and between the adjacent unit cells.

The present invention provides a semiconductor device comprising: a semiconductor body having grooves, unit cell regions surrounded by the grooves, at least a field relaxation region separated by the grooves from the unit cell regions; gate insulating films extending within the grooves and over the field relaxation regions; gate electrodes extending over the gate insulating film; inter-layer insulators covering the gate electrodes; and a top electrode extending over the inter-layer insulators and in contact with parts of the unit cell regions, and the top electrode having a generally flat upper surface.

The above and other objects, features and advantages of the present invention will be apparent from the following descriptions

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

A first aspect of the present invention is a semiconductor device comprising: a semiconductor body having grooves, unit cell regions surrounded by the grooves, at least a field relaxation region separated by the grooves from the unit cell regions; gate insulating films extending within the grooves and over the field relaxation regions; gate electrodes extending over the gate insulating film; inter-layer insulators covering the gate electrodes; and a top electrode extending over the inter-layer insulators and in contact with parts of the unit cell regions, and the top electrode having a generally flat upper surface.

It is preferable that the field relaxation region has a bottom level which is slightly deeper than a bottom level of the grooves.

It is also preferable that the field relaxation region has a bottom level which is slightly shallower than a bottom level of the grooves.

It is also preferable that the field relaxation region has a width wider than a width of the grooves.

It is also preferable that the field relaxation region has a top level which is substantially the same as a top level of the unit cell regions.

It is also preferable that the unit cell regions are aligned in matrix, and each of the grooves surrounds corresponding one of the unit cell regions, and the field relaxation region surround the grooves and separates the grooves from each other.

It is also preferable that each of the unit cell regions comprises a base region, a back gate region selectively extending in an upper region of the base region, and source regions selectively extending in upper regions of the base region and the back gate region. It is further preferable that the top electrode comprises a source electrode having ohmic contacts with the unit cell regions.

First Embodiment

Figure 1:
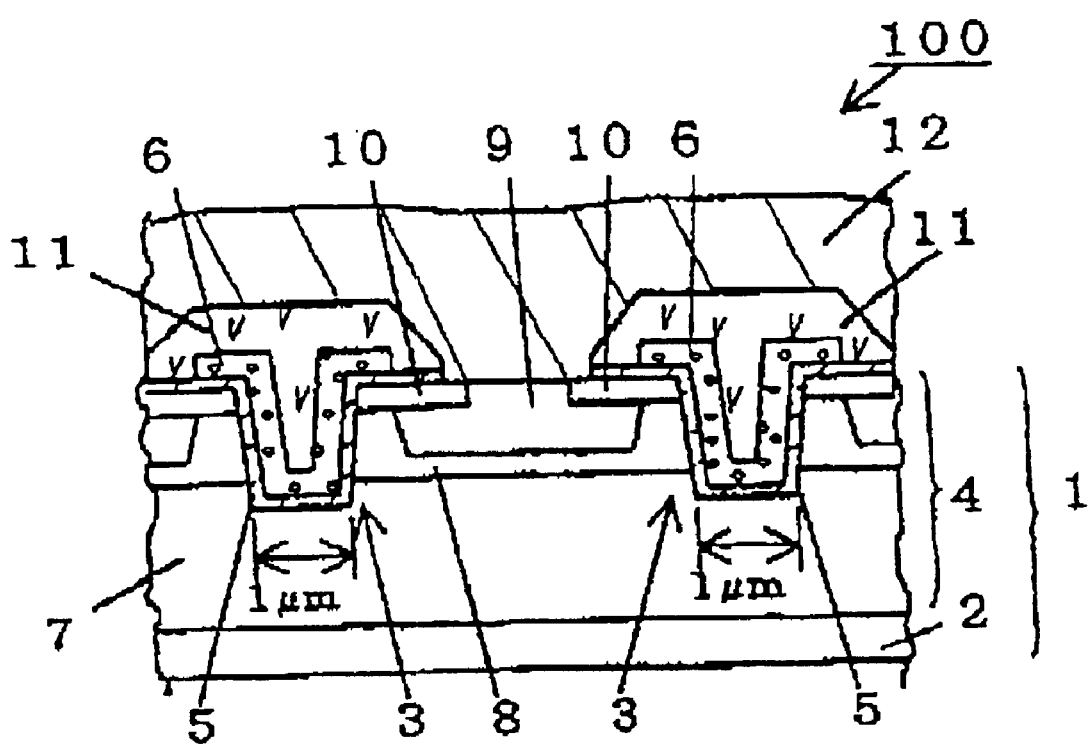
FIG. 1 is a fragmentary cross sectional elevation view of a conventional UMOS-structure of a semiconductor device, wherein a groove width is 1 micrometer.
Figure 2:
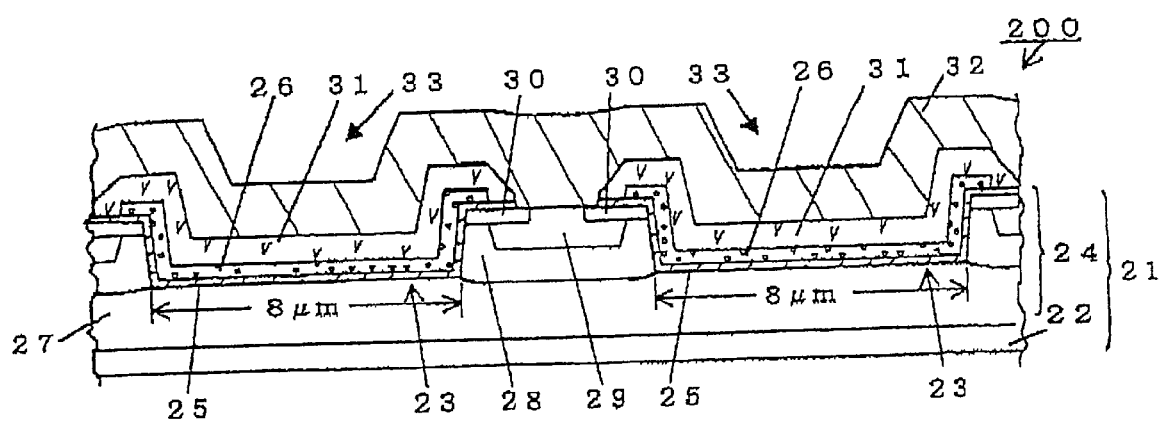
FIG. 2 is a fragmentary cross sectional elevation view of another conventional UMOS-structure of a semiconductor device, wherein a groove width is 8 micrometer.
Figure 3:
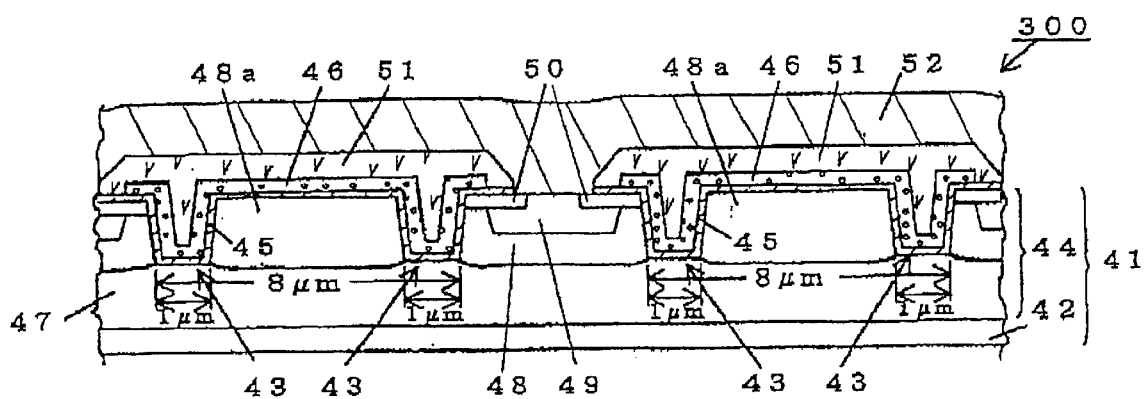
FIG. 3 is a fragmentary cross sectional elevation view of a novel UMOS-structure of a semiconductor device in accordance with the first embodiment of the present invention.
Figure 4:
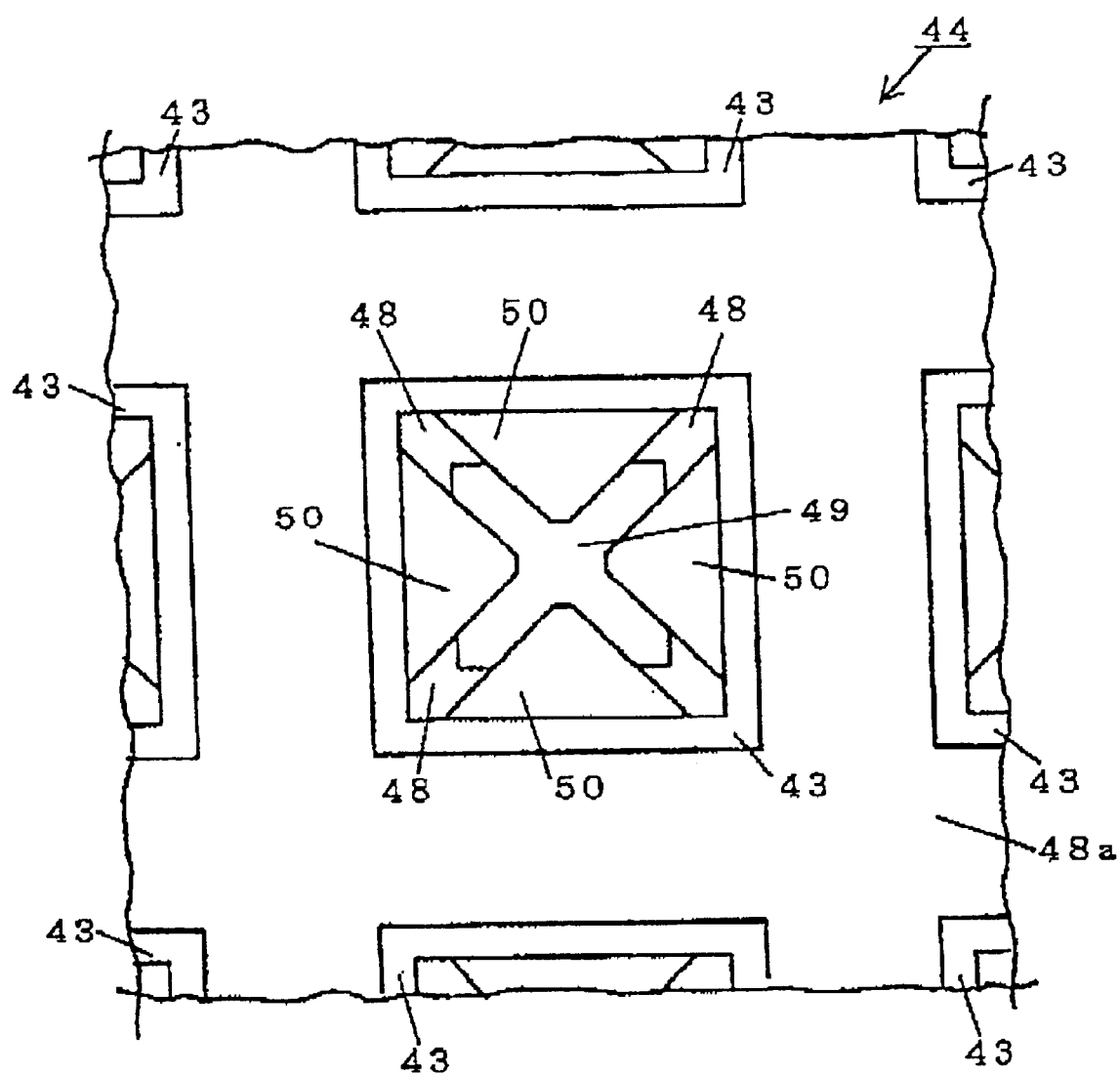
FIG. 4 is a plan view of the novel UMOS-structure of FIG. 3.

A first embodiment according to the present invention will be described in detail with reference to the drawings. FIG. 3 is a fragmentary cross sectional elevation view of a novel UMOS-structure of a semiconductor device in accordance with the first embodiment of the present invention. FIG. 4 is a plan view of the novel UMOS-structure of FIG. 3. A semiconductor device 300 is designed to have a source-drain withstand voltage in the range of 200–250V The semiconductor device 300 has a semiconductor body 41 which comprises an n+-type silicon substrate 42 and an epitaxial layer 44 overlying the n+-type silicon substrate 42.

The epitaxial layer 44 has a matrix array, in plan view, of U-grooves 43 which have a U-shape in vertically cross sectional view and also extend in a form of square-loops in the plan view. The each square-loop of the U-groove 43 surrounds the each unit cell serving as a transistor. The each square-loop of the U-groove 43 further separates a square-shaped unit cell region from a peripheral region which surrounds the each square-loop of the U-groove 43. Each of the U-grooves 43 extending in the form of square-loops has a bottom width of 1 micrometer. The square-shaped unit cell region is defined by the square-loop of the U-groove 43. A distance of the adjunct two of the square-shaped unit cell regions is 8 micrometers. A width of the peripheral region is 6 micrometers.

The epitaxial layer 44 includes an n--type drain region 47, a p-type base region 48, a p-type field relaxation region 48a, p+-type back gate regions 49, and n+-type source regions 50. The n--type drain region 47 overlies the n+-type silicon substrate 42. The p-type base region 48 overlies the n--type drain region 47, wherein the p-type base region 48 is present in the unit cell region. The p-type field relaxation region 48a also overlies the n--type drain region 47, wherein the p-type field relaxation region 48a is present in the peripheral region. The p-type base region 48 is separated by the U-groove 43 from the p-type field relaxation region 48a. The p-type base region 48 is surrounded by the square-loop of the U-groove 43, and the square-loop of the U-groove 43 is further surrounded by the p-type field relaxation region 48a.

As shown in FIG. 4, the p-type field relaxation region 48a separates the U-grooves 43 from each other, wherein the U-grooves 43 are aligned in matrix. Each of the U-grooves 43 extends in the form of square-loop, so that each of the U-grooves 43 surrounds the square-shaped unit cell region. The square-shaped unit cell region includes four-divided triangle-shaped n+-type source regions 50, and a cross-shaped region which defines the four-divided triangle-shaped n+-type source regions 50, wherein the cross-shaped region further comprises the single p+-type back gate region 49 and the four p-type base regions 48.

The U-grooves 43 reach the upper portions of the n--type drain region 47. The p+-type back gate regions 49 are selectively provided in the p-type base region 48, so that each of the p+-type back gate regions 49 is separated by the p-type base region 48 from the adjunct U-grooves 43 and also from the n--type drain region 47. The n+-type source regions 50 are selectively provided in upper regions of the p-type base region 48 and the p+-type back gate regions 49. The n+-type source regions 50 are adjacent to the upper regions of the adjunct U-grooves 43. The bottoms of the p-type base region 48 and the p-type field relaxation region 48a are slightly deeper in level than the bottoms of the U-grooves 43.

Gate insulting films 45 extend on the side walls and the bottom of the U-grooves 43 and also over parts of the n+-type source regions 50 as well as extend over the p-type field relaxation region 48a as the peripheral regions of the epitaxial layer 44, so that the gate insulating film 45 continuously extends between the adjacent two of the U-grooves 43. Gate electrodes 46 are provided, which extend on the gate insulting films 45, so that a majority part of the gate electrode 46 is positioned over the p-type field relaxation region 48a and a minority part thereof is positioned within the U-groove 43. The gate electrodes 46 comprise polysilicon films.

Inter-layer insulators 51 are selectively provided over the gate electrodes 46 and the gate insulating films 45, so that the inter-layer insulators 51 cover the gate electrodes 46 and the gate insulating films 45. The inter-layer insulators 51 do not overly parts of the n+-type source regions 50 and the p+-type back gate regions 49. A source electrode 52 is provided which overlies the inter-layer insulators 51, the n+-type source regions 50 and the p+-type back gate regions 49, so that the source electrode 52 has an ohmic contact with the n+-type source regions 50 and the p+-type back gate regions 49. Parts of the source electrode 52 over the unit cells also serve as source pads which allows external electrical connections.

The width of the U-grooves 43 is narrow, for example, 1 micrometer, for which reason an upper surface of the source electrode 52 is generally flat. Further, the field relaxation region 48a is provided between the adjacent two U-grooves 43, and the distance of 6 micrometers of the field relaxation region 48a is so decided as to ensure a source-drain withstand voltage in the range of 200–250 V. Namely, the novel UMOS-structure provides the flat upper surface of the source electrode 52 serving as the source pad and the high withstand voltage. This flat upper surface of the source pad allows a secure bonding to a wiring layer of Al of Au.

Further, the gate insulating film 45 is sandwiched by the gate electrode 46 and the drain region 47 but only on the narrow bottom region of the U-groove 43 which extends in the form of the square-loop. This means that the area of the gate insulating film 45 sandwiched by the gate electrode 46 and the drain region 47 is defined by the area of the narrow bottom region of the U-groove 43. Namely, the area of the gate insulating film 45 sandwiched by the gate electrode 46 and the drain region 47 is small, thereby providing a reduced gate-drain capacitance.

Furthermore, the field relaxation region 48a provides a floating base effect, wherein upon application of a source-drain bias, a space charge region extends flat between the adjacent unit cells. This allows the device to have a high withstand voltage.

FIGS. 5A through 5D are fragmentary cross sectional elevation views of semiconductor devices in sequential steps involved in a novel fabrication method in this first embodiment of the present invention.

Figure 5A:
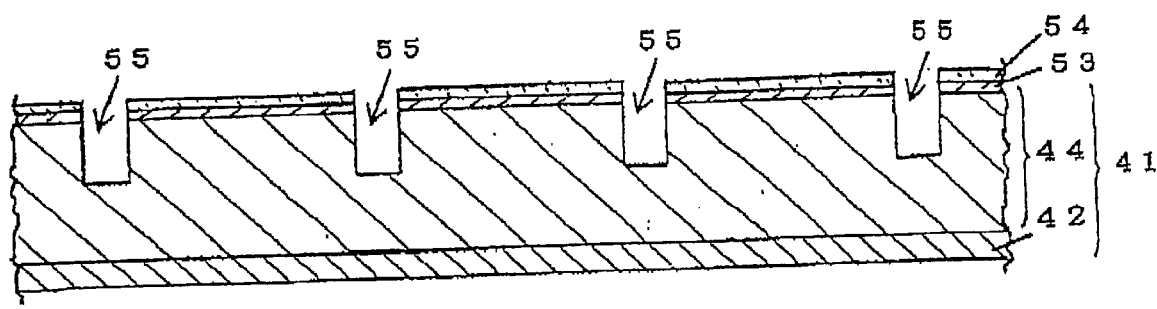
FIGS. 5A through 5D are fragmentary cross sectional elevation views of semiconductor devices in sequential steps involved in a novel fabrication method in this first embodiment of the present invention.

With reference to FIG. 5A, an n--type epitaxial layer 44 is formed on an n+-type silicon substrate 42, to form a semiconductor body 41, A surface of the n--type epitaxial layer 44 is subjected to a thermal oxidation, to form a silicon oxide film 53 having a thickness of about 500 angstroms on the surface of the n--type epitaxial layer 44. A chemical vapor deposition is carried out to deposit a silicon nitride film 54 having a thickness of about 900 angstroms on the silicon oxide film 53. A resist film is applied on the upper surface of the silicon nitride film 54. A resist film is patterned by a lithography technique to form a resist pattern which serves as an etching mask. An anisotropic etching is carried out by use of the resist pattern as a mask for selectively etching the silicon nitride film 54, 10 the silicon oxide film 53 and the n--type epitaxial layer 44, thereby forming original grooves 55 having a depth of 1.3 micrometers. The silicon oxide film 53 will serve as a buffer layer for a stress applied in a future local oxidation of silicon as LOCOS. The silicon nitride film 54 will serve as a mask for the selective oxidation process as LOCOS.

Figure 5B:
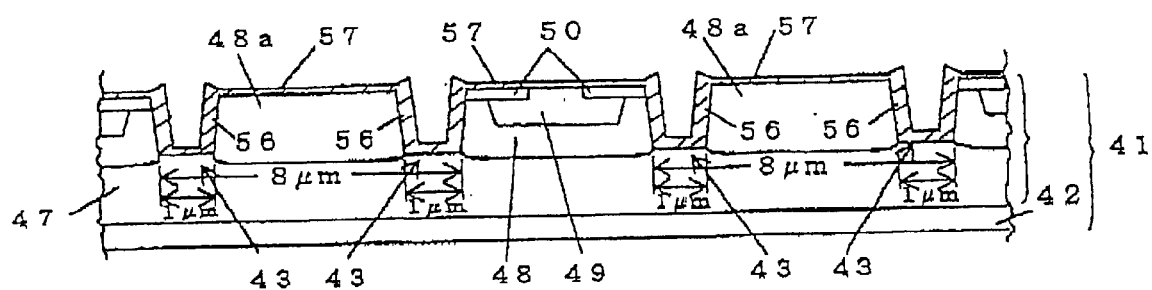

With reference to FIG. 5B, a thermal oxidation process is carried out at a temperature of about 1140° C. by using the silicon nitride film 54 as a mask for selectively oxidizing the bottom and side walls of each of the original grooves 55, thereby forming LOCOS oxide films 56 having a thickness of 7000 angstroms on the bottom and side walls of each of the original grooves 55. As a result, the original trench grooves 55 becomes U-grooves 43. The silicon nitride film 54 and the silicon oxide film 53 are removed by an isotropic etching process. A thermal oxidation is carried out to form a silicon oxide film 57 having a thickness of 100 angstroms. The LOCOS oxide films 56 are used as masks for carrying out an ion-implantation of boron through the silicon oxide film 57 into the epitaxial layer 44, thereby forming the p-type base regions 48 and the p-type field relaxation region 48a. Resist patterns are formed which cover parts of the base region 48 and the entirety of the field relaxation region 48a for carrying out an ion-implantation of B or $BF_2$ into parts of the base region 48. The used resist patterns are removed. A heat treatment is then carried out for causing a thermal diffusion of B or $BF_2$ to form p+-type back gate regions 49. Other resist patterns are selectively formed which cover parts of the base region 48 and the back gate region 49 as well as cover the entirety of the field relaxation region 48a. An ion-implantation of arsenic or phosphorus is carried out by use of the resist patterns and the LOCOS oxide films 56 as masks for selectively introducing arsenic or phosphorus into parts of the back gate region 49 and the base region 48. The used resist patterns are then removed. A heat treatment is then carried out for thermally diffusing the arsenic or phosphorus to form n+-type source regions 50 in the parts of the back gate region 49 and the base region 48. The original part of the epitaxial layer 44 becomes the drain region 47.

Figure 5C:
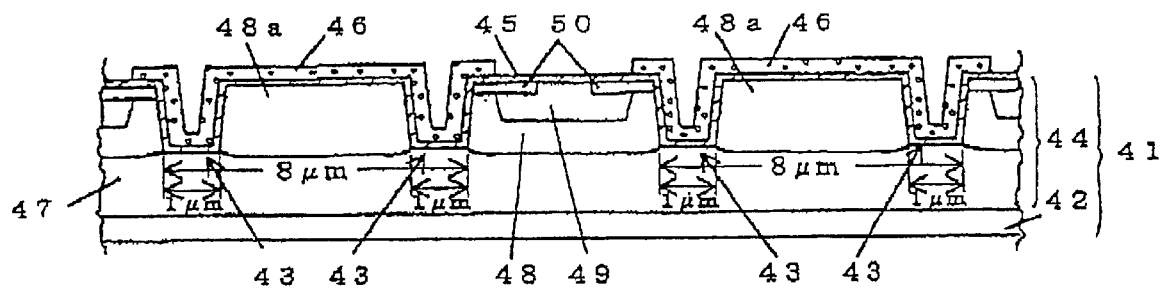

With reference to FIG. 5C, the LOCOS oxide films 56 and the oxide films 57 on the surface of the epitaxial layer 44 are removed by an isotropic etching. A thermal oxidation is carried out to form a gate oxide film 45 on the surface of the epitaxial layer 44 and the bottom and side walls of each of the grooves 43. A chemical vapor deposition method is carried out to form a polysilicon film having a thickness of about 4700 angstroms on the gate oxide film 45. Resist patterns are selectively formed over the polysilicon film. The polysilicon film is selectively etched by an anisotropic etching process to form gate electrodes 46.

Figure 5D:
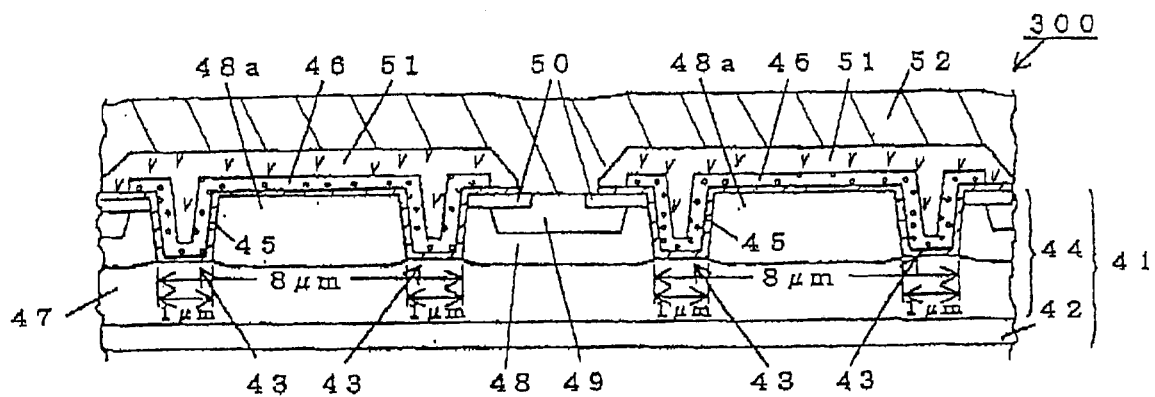

With reference to FIG. 5D, a chemical vapor deposition is carried out to deposit an inter-layer insulator 51 having a thickness of about 17000 angstroms within the grooves 43 and over the epitaxial layer. Contact windows are then formed in the inter-layer insulator 51 and the gate oxide film 45 so that parts of the source regions 50 and the back gate regions 49 are exposed. An aluminum film is deposited by a sputtering method. The aluminum film is then patterned by a lithography and dry etching process to form source electrodes 52 which have ohmic contacts with the back gate region 49 and the source regions 50. Although illustration is omitted, gate pads are concurrently formed for external connection from the gate electrodes 46. Parts of the source electrodes 52 serve as source pads for external connection from the source electrodes 52.

Figure 6:
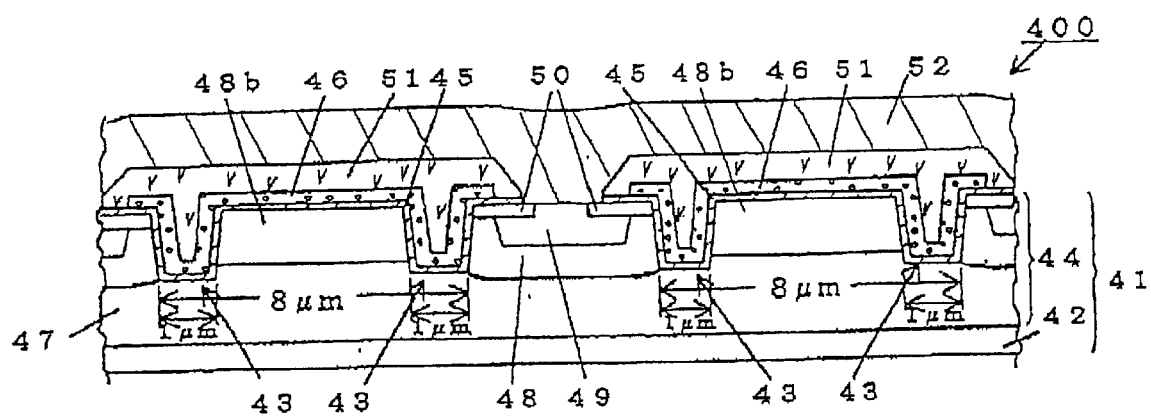
FIG. 6 is a fragmentary cross sectional elevation view of a modified UMOS structure from the structure of FIG. 3.

FIG. 6 is a fragmentary cross sectional elevation view of a modified UMOS structure from the structure of FIG. 3. A modified semiconductor device 400 has shallow field relaxation regions 48b which have a shallower bottom level than the bottoms of the U-grooves 43 to reduce an RjFET component.

As another modification, the field relaxation regions 48a are connected to source electrodes.

It is also possible to modify the patterns shown in FIG. 4. Source region patterns may be other unlooped patterns or looped patterns surrounding the back gate.

It is also possible to modify the pattern of the U-grooves 43 so that the U-grooves 43 extend in a form of stripe.

In accordance with the above descriptions, for forming the back gate region 49 and the source regions 50, the entire surfaces of the field relaxation layers 48a are covered by the resist patterns to prevent ion-implantation into the field relaxation layers 48a. It is, however, possible as a modification that without masking the entire surfaces of the field relaxation layers 48a, the ion-implantation into the field relaxation layers 48a is made to form back gate region and source regions in the field relaxation region.

If in case of n-channel MOSFET, the n+-type impurity layer is formed in the field relaxation layer at the same time when the source region is formed, then the thickness of the gate oxide film on the shoulder portions of the U-grooves are thicker than when the n+-type impurity layer is not formed, whereby a high withstand voltage can be obtained.

If in case of p-channel MOSFET, the n+-type impurity layer is formed in the field relaxation layer at the same time when the back gate is formed, then the thickness of the gate oxide film on the shoulder portions of the U-grooves are thicker than when the n+-type impurity layer is not formed, whereby a high withstand voltage can be obtained.

The above conductivity types are mere examples. Opposite conductivity types of the respective layers or regions may be available.

In accordance with the above descriptions, the semiconductor body 41 comprises the substrate 42 and the epitaxial layer 44. It is also possible as a modification that the semiconductor body comprises a semiconductor substrate only. In this case, an n-type high impurity concentration layer is formed on a bottom surface of the substrate.

The width of the U-grooves 43 is narrow, for example, 1 micrometer, for which reason an upper surface of the source electrode 52 is generally flat. Further, the field relaxation region 48a is provided between the adjacent two U-grooves 43, and the distance of 6 micrometers of the field relaxation region 48a is so decided as to ensure a source-drain withstand voltage in the range of 200–250 V. Namely, the novel UMOS-structure provides the flat upper surface of the source electrode 52 serving as the source pad and the high withstand voltage. This flat upper surface of the source pad allows a secure bonding to a wiring layer of Al or Au.

Further, the gate insulating film 45 is sandwiched by the gate electrode 46 and the drain region 47 but only on the narrow bottom region of the U-groove 43 which extends in the form of the square-loop. This means that the area of the gate insulating film 45 sandwiched by the gate electrode 46 and the drain region 47 is defined by the area of the narrow bottom region of the U-groove 43. Namely, the area of the gate insulating film 45 sandwiched by the gate electrode 46 and the drain region 47 is small, thereby providing a reduced gate-drain capacitance.

Furthermore, the field relaxation region 48a provides a floating base effect, wherein upon application of a source-drain bias, a space charge region extends flat between the adjacent unit cells. This allows the device to have a high withstand voltage.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device comprising:
   a semiconductor body having grooves, unit cell regions surrounded by said grooves, at least a field relaxation region separated by said grooves from said unit cell regions;
   gate insulating films extending within said grooves and over said field relaxation regions;
   gate electrodes extending over said gate insulating film;
   inter-layer insulators covering said gate electrodes; and
   a top electrode extending over said inter-layer insulators and in contact with parts of said unit cell regions, and said top electrode having a generally flat upper surface.

2. The semiconductor device as claimed in claim 1, wherein said field relaxation region has a bottom level which is slightly deeper than a bottom level of said grooves.

3. The semiconductor device as claimed in claim 1, wherein said field relaxation region has a bottom level which is slightly shallower than a bottom level of said grooves.

4. The semiconductor device as claimed in claim 1, wherein said field relaxation region has a width wider than a width of said grooves.

5. The semiconductor device as claimed in claim 1, wherein said field relaxation region has a top level which is substantially the same as a top level of said unit cell regions.

6. The semiconductor device as claimed in claim 1, wherein said unit cell regions are aligned in matrix, and each of said grooves surrounds corresponding one of said unit cell regions, and said field relaxation region surround said grooves and separates said grooves from each other.

7. The semiconductor device as claimed in claim 1, wherein each of said unit cell regions comprises a base region, a back gate region selectively extending in an upper region of said base region, and source regions selectively extending in upper regions of the base region and the back gate region.

8. The semiconductor device as claimed in claim 7, wherein said top electrode comprises a source electrode having ohmic contacts with said unit cell regions.

* * * * *